March 8, 1966 D. C. T. SHANG 3,239,786

HALL GENERATOR AND METHOD OF FABRICATION

Filed May 9, 1963

DAVID C. T. SHANG
INVENTOR

BY S. A. Giarratana
Francis L. Masselle
ATTORNEYS 3,239,786
Patented Mar. 8, 1966

3,239,786

HALL GENERATOR AND METHOD OF FABRICATION

David C. T. Shang, Cedar Grove, N.J., assignor to General Precision Inc., Little Falls, N.J., a corporation of Delaware Filed May 9, 1963, Ser. No. 279,184
7 Claims. (Cl. 338—32)

Figure 1:
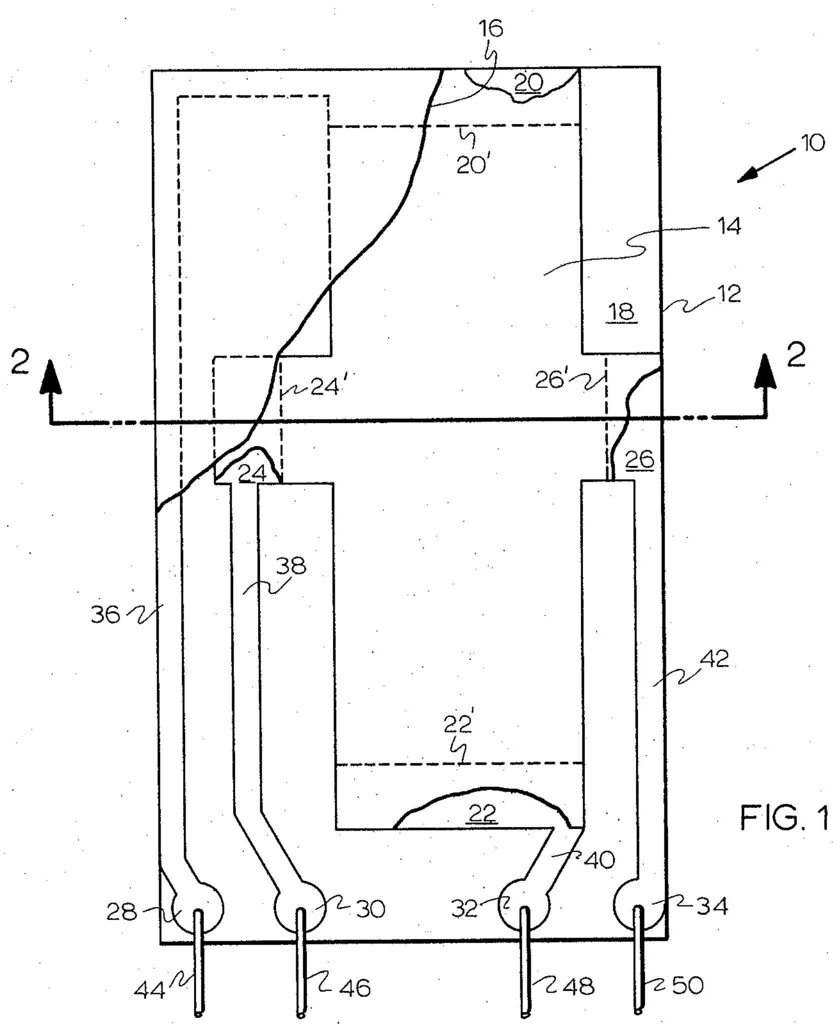

This invention relates to semiconductor devices of the type generally referred to in the art as "Hall generators," and to methods of their fabrication.

The Hall effect and its application to semiconductors are well known. The effect finds practical utilization in devices which have come to be known as Hall generators and, briefly and generally stated, consist of a quadrangular plate of semiconductive material having an ohmic contact or electrode on each edge. The electrodes on parallel edges are located directly opposite each other and symmetrically disposed with respect to a line drawn perpendicular to such edges. When a potential is applied between one pair of opposed electrodes and the plate of semiconductive material is disposed in an electromagnetic flux field directed perpendicular to its major surfaces, a voltage, known as the Hall voltage, is generated between the other pair of electrodes.

In most fields of application of Hall generators it is highly desirable, if not absolutely essential, that the Hall voltage be substantially zero in the absence of an applied electro-magnetic flux field. Achievement of this null condition requires extremely precise location and alignment of the electrodes. The requisite precision is very difficult to obtain by conventional production techniques and, as a result, high quality Hall generators are practically custom fabricated and priced accordingly.

The problem of eliminating zero field voltage in Hall generators is complicated by the fact of their small size, susceptibility to distortion, and sensitivity to internal stresses.

It is the fundamental general object of the present invention to provide Hall generators and a method of their fabrication which avoid or mitigate at least one of the problems of the prior art as outlined above.

A more specific object is the provision of a method of fabricating Hall generators which facilitates precise location and alignment of the operating electrodes.

Another object is the provision of Hall generators which are protected from mechanical strain and adverse thermal effects.

To the accomplishment of these and further objects the present invention contemplates a method of fabricating the Hall generator which comprises providing a cruciform plate of semiconductive material; providing a substrate of refractory dielectric material having a major planar surface larger than the corresponding dimensions of the cruciform plate; applying, on a major surface of the refractory plate, four spaced contact pads of electrically conductive material, the size, shape, and spacing of which pads conform to quadrangular terminal areas on the respective extremities of the cruciform plate. The cruciform plate is disposed on the surface of the refractory plate with the terminal areas in precise congruent superposition to the respective contact pads and ohmic solder connections are formed between each of the respective contact pads and terminal areas of the cruciform plate.

The invention also contemplates, as an article of manufacture, a Hall generator comprising plates of dielectric material and a cruciform plate of semiconductive material, said plates being arranged and bonded together in congruent superposition with the semiconductive plate interposed between the plates of dielectric material; and a printed circuit pattern of conductive material on the inner surface of one of the outer plates providing individual electrical connections and ohmic contacts to terminal areas of the extremities of the cruciform plate. The printed circuit pattern includes rectangular contact pads disposed in surface contact with and conforming precisely to the terminal portions of the extremities of the cruciform plate; terminal connection points individual to each contact pad located adjacent an edge of said one outer plate; and conductive strips connecting the contact points to respective contact pads.

Figure 2:
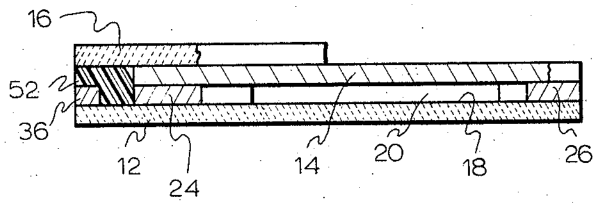

Additional objects of the invention, its advantages, scope, and the manner in which it may be practiced will be more fully apparent to persons conversant with the art from the following description of exemplary embodiments thereof taken in conjunction with the subjoined claims and annexed drawings in which like reference numerals denote like parts throughout the several views, and FIGURE 1 is a plan view of a Hall generator device in accordance with the present invention illustrated with various parts partially broken away to reveal the underlying structure; and FIGURE 2 is a sectional view taken on line 2—2 of FIGURE 1 looking in the direction of the arrows.

As best appears in FIGURE 1, the Hall generator 10 consists of three principal components: a supporting plate or substrate 12; a cruciform plate 14 of semiconductive material frequently referred to in the art as a Hall plate or Hall crystal; and a cover plate 16. In FIGURE 1 a major portion of plate 16 is broken away to disclose the underlying structure; however, in the illustrated embodiment as well as in most of the commercial forms of the device plates 12 and 16 would be substantially identical in size and configuration.

While a wide variety of refractory dielectric materials might be used for plates 12, 16, and a different material might be employed for each plate, both are preferably fabricated of a ceramic material such as alumina ($Al_2O_3$), beryllia (BeO), silicon carbide (SiC) or the like. In most cases it is highly desirable that plates 12 and 16 be adapted to serve as heat sinks and in such cases ceramics of relatively higher thermal conductivity such as beryllia should be used.

One of the ceramic plates, 12 in the illustrated embodiment, has on one of its major planar surfaces 18 a plurality of spaced quadrangular contact pads 20, 22, 24, 26 of electrically conductive material having a relatively high melting point (i.e., high as compared to "soft" solder) and capable of making ohmic contact with the semiconductive material which makes up Hall plate 14. Pads 20, 22, 24, 26 conform in size, shape, and spacing to quadrangular terminal areas on the respective extremities of the cruciform Hall plate. In the illustration (FIGURE 1) these terminal areas are delimited from the remainder of the semiconductor plate by broken lines 20′, 22′, 24′ and 26′, respectively, which coincide with and represent the inner edges of the contact pads beneath the semiconductor plate. More specifically, it will be seen from FIGURE 1 that the contact pads constitute opposed pairs 20, 22 and 24, 26, of pads, each pair being substantially identical in size and configuration and located adjacent opposite parallel edges of the extremities of cruciform semiconductor plate 14. For ease of reference pads 20 and 22 are now designated and may hereinafter be referred to as the current electrodes with allusion to the fact that they constitute the source and drain of the current produced by the applied voltage; accordingly, 24 and 26 are the Hall voltage electrodes.

As previously explained it is essential to the attainment of zero or negligible Hall voltage in the absence of an applied electromagnetic flux field that the electrodes be symmetrically disposed with respect to the longitudinal and transverse axes of symmetry, as the case may be, and that these axes be perpendicular at a point of intersection at the center of the Hall plate. The manner in which these precise conditions are achieved with relative ease will be more readily apparent from the description of the method of fabricating the device contemplated by the present invention which appears hereinbelow.

Each of the contact pads 20, 22, 24, 26 is electrically connected to a respective terminal point 28, 30, 32, 34 by individual conductive stripes 36, 38, 40, 42 of conductive material on the major surface of plate 12. The contact points are located adjacent one edge of the ceramic plate and have respective conductive wire leads 44, 46, 48, 50 secured thereto so as to project from between plates 12 and 16 for circuit connections. The voids between ceramic plates 12 and 16 around the edges of the cruciform Hall plate 14 are filled with a potting composition (shown at 52, FIGURE 2), hereinafter described with greater particularity, so that the Hall plate is hermetically encapsulated between the ceramic plates.

Thus, it will be seen that ceramic plates 12, 16 provide a rigid mechanical support for the Hall plate, protecting it from physical stresses which might affect its operation as well as from dilatorious environmental conditions. In addition the plates serve as a heat sink to dissipate heat generated by the Peltier effect at the junctions of the semiconductor material and the contact pads. This heat dissipation is enhanced by the use of a particular potting composition containing a suitable filler material which reduces shrinkage and increases thermal conductivity. Examples of suitable potting resins and fillers are as follows.

Potting resins:
- (1) Epoxy resin
- (2) Silicon resin
- (3) Phenolic resin
- (4) Polystrene Filler materials:
- (1) Silicon carbide
- (2) Alumina powder
- (3) Glass powder By way of example, in one practical embodiment ceramic plates .47 x .275 inch were employed having a thickness of 11 mils. Additional dimensions (in inches) were as follows: contact pads 24 and 26, .035 x .065; contact pads 20 and 22, .035 x .125; longitudinal dimension of Hall plate, .420; transverse dimension of Hall plate, .235.

The invention contemplates the following particular method for the fabrication of Hall generators as described hereinabove and illustrated in FIGURES 1 and 2.

Hall plate 14, of germanium or other suitable semiconductor, is produced in accordance with established techniques well known in the art and cut or otherwise formed to the desired dimensions and cruciform configuration. With due consideration for the particular dimensions of the Hall plate, a printed circuit pattern of conductive material consisting of contact pads 20, 22, 24, 26, terminal spots 28, 30, 32, 34 and conductor stripes 36, 38, 40 and 42 is applied to one major planar surface of ceramic plate 12. The pattern is formed of a relatively high melting point conductive material, preferably silver, and is conveniently applied by means of a silk screen technique. Satisfactory results have been obtained using commercially available silver paste of the fired-on type, cured at a temperature of between 1100° and 1200° F. for one-half hour.

Hall plate 14 is then precisely positioned on the printed circuit pattern so that the quadrangular terminal portions 20′, 22′, 24′ and 26′ overlie and register exactly with the respective contact pads 20, 22, 24 and 26. In order to maintain the exact position of the Hall plate on ceramic support plate 12, a thin film of a high temperature resistant adhesive is applied to one or both of the mating surfaces of the plates.

With the relative position of the Hall plate on the support plate thus established and maintained, relatively low melting point solder capable of forming an ohmic contact between the silver contact pads and the semiconductive material of the Hall plate is applied along the edges of the interface between the contact pads and the extremities of the cruciform plate. For a germanium Hall plate and silver contact pads, lead-antimony solder may be used. Heat is then applied in any suitable manner sufficient to melt the solder, which is drawn by capillary action between the mating surfaces of the contact pads and the extremities of the cruciform plate, forming an ohmic connection therebetween.

An epoxy resin is then applied to the upper surfaces of ceramic plate 12 and Hall plate 14 and cover plate 16 installed.

As previously mentioned, the epoxy utilized to bond cover plate 16 to support plate 12 completely fills the voids surrounding the Hall plate and preferably contains suitable fillers such as $Al_2O_3$ and/or silicon carbide to control shrinkage, and improve thermal conductivity where it is desired to enhance heat dissipation.

It will be appreciated that the method described above eliminates the need for soldering lead wires directly to the Hall plate and permits the accurate alignment of electrodes automatically and with relative ease.

While there has been described what at present is believed to be the preferred embodiment of this invention, it will be obvious to those skilled in the art that various changes and modifications may be made therein without departing from the invention, and it is aimed, therefore, to cover in the appended claims all such changes and modifications as fall within the true spirit and scope of the invention.

What is claimed is:

1. A Hall generator comprising:

plates of dielectric material and a cruciform plate of semiconductive material, said plates being arranged and bonded together in congruent superposition with the cruciform plate interposed between the plates of dielectric material;

and a printed circuit pattern of conductive material on the inner surface of one of the plates of dielectric material providing individual electrical connections and ohmic contacts to terminal areas of the extremities of the cruciform plate, said pattern including rectangular contact pads disposed in surface contact with and conforming precisely to the terminal portions of the extremities of the cruciform plate, terminal connection points individual to each of said contact pads located adjacent an edge of said one plate, and conductive strips connecting the contact points to respective contact pads.

2. A Hall generator in accordance with claim 1 including a layer of adhesive material bonding said dielectric plates together and filling voids therebetween around the perimeter of said cruciform semiconductive plate whereby said semiconductive plate is hermetically sealed between said dielectric plates.

3. A Hall generator in accordance with claim 2 wherein said adhesive material is an epoxy resin containing a filler in sufficient quantities to control shrinkage of the epoxy during curing and increase the thermal conductivity of the epoxy.

4. A Hall generator in accordance with claim 3 wherein said filler is silicon carbide.

5. A method of fabricating a Hall generator, comprising:

providing a cruciform plate of semiconductive material;

providing a substrate of refractory dielectric material having a major planar surface larger than corresponding dimensions of the cruciform plate;

applying, on a major surface of the refractory plate, four spaced contact pads of electrically conductive material, the size, shape and spacing of said pads conforming to quadrangular terminal areas on the respective extremities of the cruciform plate;

disposing the cruciform plate on said surface of the refractory plate with said terminal areas in precise congruent superposition to the respective contact pads; and forming an ohmic solder connection between each of the respective contact pads and terminal areas of the cruciform plate.

6. A method of fabricating a Hall generator, comprising:

providing a cruciform plate of semiconductive material;

providing a quadrangular plate of ceramic dielectric material having planar dimensions larger than corresponding dimensions of the cruciform plate;

applying, on selected areas of a major planar surface of the ceramic plate, a layer of relatively high melting point electrically conductive material in a pattern including four spaced quadrangular contact areas conforming precisely in size and location to quadrangular terminal areas on the respective extremities of the cruciform plate, four connection terminals adjacent an edge of the plate, and individual conductor strips connecting the respective contact areas and terminals;

securing the cruciform plate on said major surface of the ceramic plate with said terminal areas in precise congruent superposition to the respective contact areas; and forming an ohmic solder connection between each of the respective contact areas of said pattern and the terminal areas of the cruciform plate.

7. A method according to claim 6 including the further step of attaching electrically conductive lead wires to said connection terminals and securing a dielectric cover plate to said major surface so as to cover at least the selected areas thereof.

References Cited by the Examiner

UNITED STATES PATENTS

| | | | |
|---|---|---|---|
| 2,407,251 | 9/1946 | Christensen | 338—333 |
| 2,725,504 | 11/1955 | Dunlap | 330—6 X |
| 2,977,450 | 3/1961 | Boicey | 338—327 |
| 3,042,887 | 7/1962 | Kuhrt et al. | 338—32 |
| 3,050,698 | 8/1962 | Brass | 307—88.5 X |
| 3,061,911 | 11/1962 | Baker | 338—307 |
| 3,139,600 | 6/1964 | Rasmanis et al. | 338—32 |
| 3,143,714 | 8/1964 | Evans et al. | 307—88.5 X |
| 3,162,932 | 12/1964 | Wood et al. | 338—32 X |

FOREIGN PATENTS

| | | |
|---|---|---|
| 860,200 | 2/1961 | Great Britain. |

RICHARD M. WOOD, *Primary Examiner.*

H. T. POWELL, W. B. BROOKS, *Assistant Examiners.*